United States Patent
Nomiyama et al.

(10) Patent No.: US 12,411,512 B2
(45) Date of Patent: Sep. 9, 2025

(54) LOW DROPOUT REGULATOR, CLOCK GENERATING CIRCUIT, AND MEMORY DEVICE

(71) Applicant: Samsung Electronics Co., Ltd., Suwon-si (KR)

(72) Inventors: Takahiro Nomiyama, Suwon-si (KR); Yongmin Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 47 days.

(21) Appl. No.: 18/490,240

(22) Filed: Oct. 19, 2023

(65) Prior Publication Data
US 2024/0184320 A1    Jun. 6, 2024

(30) Foreign Application Priority Data

Oct. 24, 2022 (KR) .................. 10-2022-0137764
Dec. 27, 2022 (KR) .................. 10-2022-0186388

(51) Int. Cl.
*G05F 1/575* (2006.01)
*G11C 11/4074* (2006.01)
*G11C 11/4076* (2006.01)

(52) U.S. Cl.
CPC .......... *G05F 1/575* (2013.01); *G11C 11/4074* (2013.01); *G11C 11/4076* (2013.01)

(58) Field of Classification Search
CPC .. G05F 1/575; G11C 11/4074; G11C 11/4076
See application file for complete search history.

(56) References Cited

U.S. PATENT DOCUMENTS

| | | |
|---|---|---|
| 6,507,519 B1 | 1/2003 | Collins et al. |
| 6,703,885 B1 | 3/2004 | Fan et al. |
| 7,449,872 B2 | 11/2008 | Zolfaghari |
| 9,122,293 B2 | 9/2015 | Price et al. |
| 9,411,348 B2 | 8/2016 | Iacob et al. |
| 10,310,528 B1 | 6/2019 | Elsayed et al. |
| 11,003,201 B1* | 5/2021 | Ahmed ............ G05F 1/59 |
| 2006/0273846 A1* | 12/2006 | Lee .............. G11C 29/021 |
| | | 327/538 |
| 2009/0284246 A1* | 11/2009 | Dash ............ G01R 31/40 |
| | | 324/76.11 |

FOREIGN PATENT DOCUMENTS

KR    10-2011-0113917 A    10/2011

* cited by examiner

*Primary Examiner* — Sultana Begum
(74) *Attorney, Agent, or Firm* — Harness, Dickey & Pierce, P.L.C.

(57) ABSTRACT

A low dropout (LDO) regulator is configured to generate first to nth output voltages, where n is a natural number greater than or equal to 2, and each of the first to nth output voltages corresponds to a reference voltage. The LDO regulator includes an amplifier configured to generate an error voltage based on the reference voltage and a first output voltage of the first to nth output voltages, a trimming control circuit configured to generate first to (n−1)th trimming signals based on the first to nth output voltages, and an output buffer circuit configured to generate the first to nth output voltages based on the error voltage and the first to (n−1)th trimming signals.

20 Claims, 9 Drawing Sheets

FIG. 9

LOW DROPOUT REGULATOR, CLOCK GENERATING CIRCUIT, AND MEMORY DEVICE

CROSS-REFERENCE TO RELATED APPLICATIONS

This application claims priority under 35 U.S.C. § 119 to Korean Patent Application No. 10-2022-0137764, filed on Oct. 24, 2022, and Korean Patent Application No. 10-2022-0186388, filed on Dec. 27, 2022, in the Korean Intellectual Property Office, the disclosures of each of which are incorporated by reference herein in their entireties.

FIELD

The inventive concepts relate to a low dropout (LDO) regulator, including an LDO regulator configured to generate an output voltage based on a trimming signal.

BACKGROUND

As technology advances, a number of chips for performing various kinds of operations are equipped in one electronic device. In this case, in order to operate the chips included in an electronic device at an accurate timing, an input of an accurate clock signal may be desired or needed. For example, modules such as dual in-line memory modules (DIMMs) each include a plurality of dynamic random access memory (DRAM) chips, and an input of an accurate clock signal may be desired or needed for accurate operation of each DRAM chip.

Clock generating circuits may generate a clock signal based on a voltage applied thereto. In this case, power conversion circuits such as LDO regulators may be used for adjusting a level of a voltage applied to a clock generating circuit. In this case, LDO regulators may apply a plurality of output voltages to a clock generating circuit through an output buffer. However, a voltage applied to a clock generating circuit may be changed due to causes such as current consumption and an internal resistance caused by a line included in an output buffer. When a voltage applied to a clock generating circuit is changed, clock skew between a plurality of clock signals generated through a clock generating circuit may occur. Clock skew may be a cause of malfunction of an electronic device such as a communication error. Therefore, the development of a method for solving such a problem may be desired or needed.

SUMMARY

The inventive concepts provide a low dropout (LDO) regulator which may apply a certain voltage to a clock generating circuit.

According to an aspect of the inventive concepts, a low dropout (LDO) regulator is configured to generate first to nth output voltages, where n is a natural number greater than or equal to 2, and each of the first to nth output voltages corresponds to a reference voltage. The LDO regulator includes an amplifier configured to generate an error voltage based on the reference voltage and a first output voltage of the first to nth output voltages, a trimming control circuit configured to generate first to (n−1)th trimming signals based on the first to nth output voltages, and an output buffer circuit configured to generate the first to nth output voltages based on the error voltage and the first to (n−1)th trimming signals.

According to another aspect of the inventive concepts, a clock generating circuit includes a low dropout (LDO) regulator configured to generate a plurality of output voltages each corresponding to a reference voltage, and a clock oscillate circuit configured to generate a plurality of clock signals based on the plurality of output voltages. The LDO regulator includes an amplifier configured to generate an error voltage based on the reference voltage and a first output voltage of the plurality of output voltages, a trimming control circuit configured to generate a plurality of trimming signals based on the plurality of output voltages, and an output buffer circuit configured to generate the plurality of output voltages based on the error voltage and the plurality of trimming signals.

According to another aspect of the inventive concepts, a memory device includes a clock generating circuit configured to generate a plurality of clock signals, and a plurality of dynamic random access memory (DRAM) chips configured to operate based on the plurality of clock signals. The clock generating circuit includes a low dropout (LDO) regulator configured to generate a plurality of output voltages each corresponding to a reference voltage, and a clock oscillate circuit configured to generate a plurality of clock signals, based on the plurality of output voltages. The LDO regulator includes an amplifier configured to generate an error voltage based on the reference voltage and a first output voltage of the plurality of output voltages, a trimming control circuit configured to generate a plurality of trimming signals based on the plurality of output voltages, and an output buffer circuit configured to generate the plurality of output voltages based on the error voltage and the plurality of trimming signals.

BRIEF DESCRIPTION OF THE DRAWINGS

Example embodiments will be more clearly understood from the following detailed description taken in conjunction with the accompanying drawings in which.

DETAILED DESCRIPTION

Hereinafter, example embodiments will be described in detail with reference to the accompanying drawings.

Figure 1:
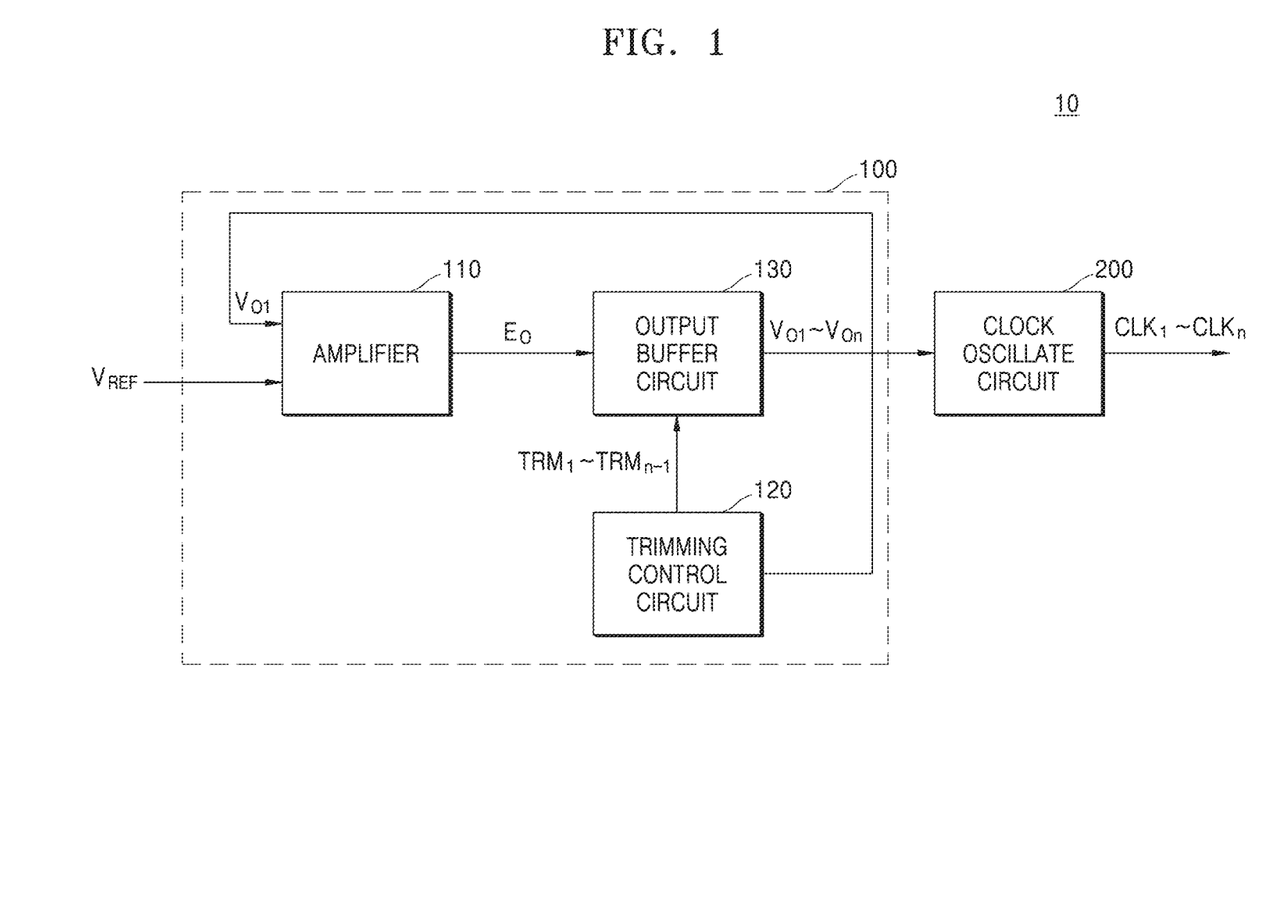
FIG. 1 is a block diagram illustrating a clock generating circuit according to an example embodiment.

FIG. 1 is a block diagram illustrating a clock generating circuit 10 according to an example embodiment.

Referring to FIG. 1, the clock generating circuit 10 according to an example embodiment may include a low dropout (LDO) regulator 100 and a clock oscillate circuit 200.

The clock generating circuit 10 may generate a plurality of clock signals $CLK_1$ to $CLK_n$. The number of clock signals $CLK_1$ to $CLK_n$ may be an n (where n is a natural number of 2 or more) number, and the plurality of clock signals $CLK_1$ to $CLK_n$ may include first to nth clock signals $CLK_1$ to $CLK_n$. The clock generating circuit 10 may output the generated plurality of clock signals $CLK_1$ to $CLK_n$ to other devices (for example, dynamic random access memory (DRAM) chips). In some example embodiments, the plurality of clock signals $CLK_1$ to $CLK_n$ generated by the clock generating circuit 10 may be used as a signal which is a criterion of an operation in the other devices. Therefore, it may be desirable for the clock generating circuit to generate the plurality of clock signals $CLK_1$ to $CLK_n$ without an error such as clock skew.

The LDO regulator 100 may generate a plurality of output voltages $V_{O1}$ to $V_{On}$ corresponding to a reference voltage $V_{REF}$. The number of output voltages $V_{O1}$ to $V_{On}$ may be an n number which is equal to the number of clock signals $CLK_1$ to $CLK_n$, and the plurality of output voltages $V_{O1}$ to $V_{On}$ may include first to nth output voltages $V_{O1}$ to $V_{On}$. For example, the LDO regulator 100 may generate the plurality of output voltages $V_{O1}$ to $V_{On}$ having the same or substantially the same level as that of the reference voltage $V_{REF}$.

The LDO regulator 100 may include an amplifier 110, a trimming control circuit 120, and an output buffer circuit 130.

The amplifier 110 may generate an error voltage $E_O$, based on the reference voltage $V_{REF}$ and the first output voltage $V_{O1}$. The amplifier 110 may amplify a difference between the reference voltage $V_{REF}$ and the first output voltage $V_{O1}$ to generate the error voltage $E_O$. For example, the amplifier 110 may subtract the reference voltage $V_{REF}$ from the first output voltage $V_{O1}$ and may amplify a subtraction result by a desired (or alternatively, predetermined) rate to generate the error voltage $E_O$.

The amplifier 110 may receive the first output voltage $V_{O1}$ from the output buffer circuit 130 described below. In some example embodiments, the first output voltage $V_{O1}$ may be a voltage which is generated by the output buffer circuit 130 at a previous stage.

The reference voltage $V_{REF}$ may be a voltage corresponding to a voltage which is to be generated by the LDO regulator 100. In an example embodiment, the reference voltage $V_{REF}$ may be a voltage which is received from an external host device. In another example embodiment, the reference voltage $V_{REF}$ may be a voltage which is stored in the LDO regulator 100.

The trimming control circuit 120 may generate a plurality of trimming signals $TRM_1$ to $TRM_{n-1}$, based on the plurality of output voltages $V_{O1}$ to $V_{On}$.

The trimming control circuit 120 may receive the plurality of output voltages $V_{O1}$ to $V_{On}$ from the output buffer circuit 130 described below. In some example embodiments, the plurality of output voltages $V_{O1}$ to $V_{On}$ may each be a voltage which is generated by the output buffer circuit 130 at a previous stage.

The plurality of trimming signals $TRM_1$ to $TRM_{n-1}$ may be used to generate the plurality of output voltages $V_{O1}$ to $V_{On}$ in the output buffer circuit 130 described below. In an example embodiment, the plurality of trimming signals $TRM_1$ to $TRM_{n-1}$ may each be a signal for control which is performed so that levels of the plurality of output voltages $V_{O1}$ to $V_{On}$ are maintained to be equal or substantially equal to one another in the output buffer circuit 130.

The number of may be an n−1 number which is one less than the number of output voltages $V_{O1}$ to $V_{On}$ and may include first to n−1th trimming signals $TRM_1$ to $TRM_{n-1}$. In some example embodiments, the first trimming signal $TRM_1$ may be a signal for control which is performed so that levels of the first output voltage $V_{O1}$ and the second output voltage $V_{O2}$ are maintained to be equal to each other. Also, the k−1th trimming signal $TRM_{k-1}$ (where k is a natural number of 2 or more and n or less) may be a signal for control which is performed so that levels of the first output voltage $V_{O1}$ and the kth output voltage $V_{Ok}$ are maintained to be equal or substantially equal to each other. Also, the n−1th trimming signal $TRM_{n-1}$ may be a signal for control which is performed so that levels of the first output voltage $V_{O1}$ and the nth output voltage $V_{On}$ are maintained to be equal to each other.

A more detailed structure and operation of the trimming control circuit 120 will be described below with reference to FIG. 3.

The output buffer circuit 130 may generate the plurality of output voltages $V_{O1}$ to $V_{On}$, based on the error voltage $E_O$ and the plurality of trimming signals $TRM_1$ to $TRM_{n-1}$. A more detailed structure and operation of the output buffer circuit 130 will be described below with reference to FIG. 2.

The clock oscillate circuit 200 may generate a plurality of clock signals $CLK_1$ to $CLK_n$, based on the plurality of output voltages $V_{O1}$ to $V_{On}$. The clock oscillate circuit 200 may include a plurality of oscillators and may respectively generate the plurality of clock signals $CLK_1$ to $CLK_n$ by using the plurality of oscillators, based on the plurality of output voltages $V_{O1}$ to $V_{On}$. In some example embodiments, the number of oscillators may be equal to the number of output voltages $V_{O1}$ to $V_{On}$, and a kth oscillator may generate a kth clock signal $CLK_k$, based on the kth output voltage $V_{Ok}$.

Figure 2:
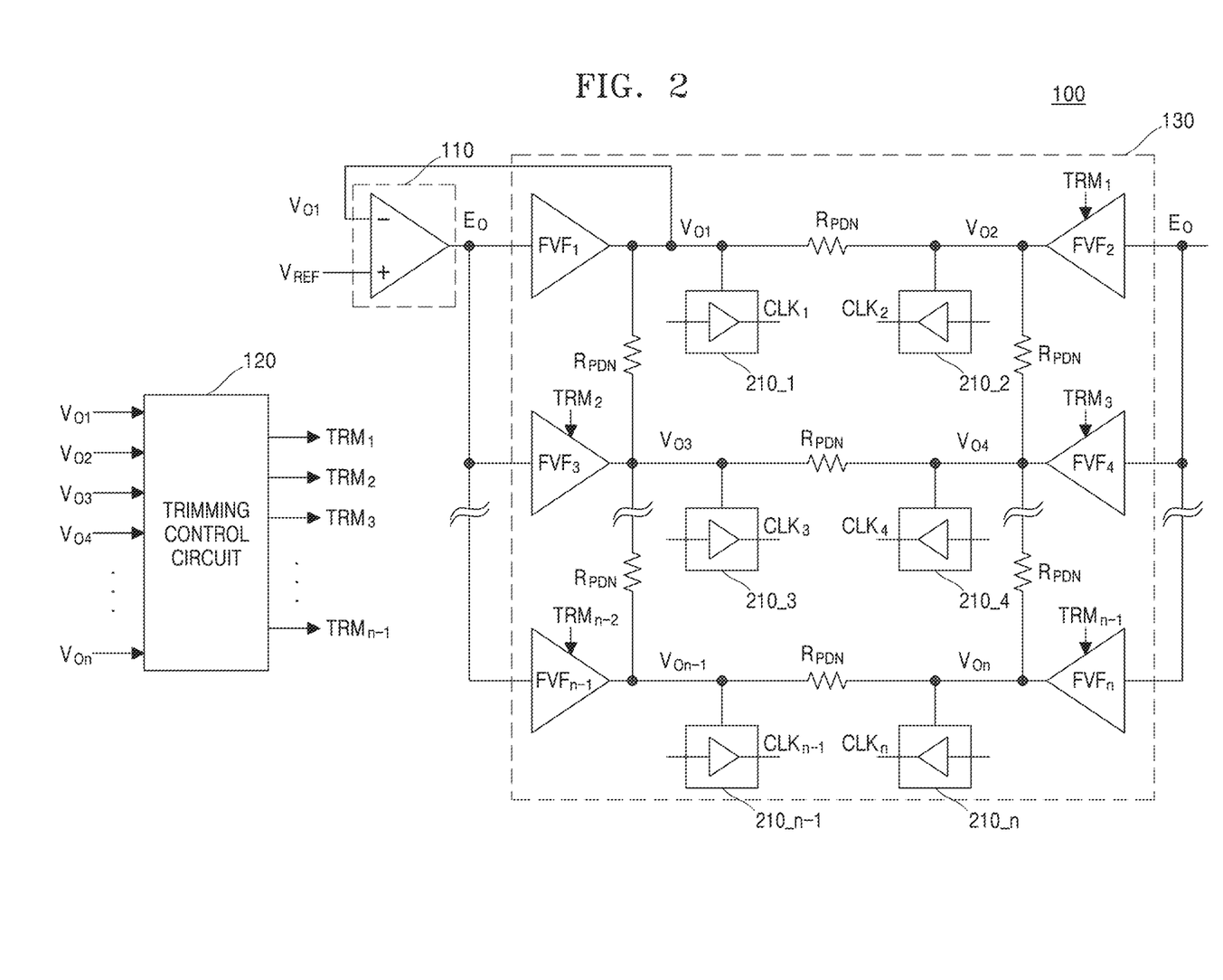
FIG. 2 is a circuit diagram illustrating a low dropout (LDO) regulator according to an example embodiment.

FIG. 2 is a circuit diagram illustrating an LDO regulator 100 according to an example embodiment.

Referring to FIG. 2, the LDO regulator 100 according to an example embodiment may include an amplifier 110, a trimming control circuit 120, and an output buffer circuit 130.

The amplifier 110 may generate an error voltage $E_O$, based on a reference voltage $V_{REF}$ and a first output voltage $V_{O1}$. In an example embodiment, the amplifier 110 may be an error amplifier.

The trimming control circuit 120 may generate a plurality of trimming signals $TRM_1$ to $TRM_{n-1}$, based on a plurality of output voltages $V_{O1}$ to $V_{On}$. A more detailed structure and operation of the trimming control circuit 120 will be described below with reference to FIG. 3.

The output buffer circuit 130 may generate the plurality of output voltages $V_{O1}$ to $V_{On}$, based on the error voltage $E_O$ and the plurality of trimming signals $TRW$ to $TRM_{n-1}$.

The output buffer circuit 130 may include a plurality of flipped voltage follower (FVF) buffers $FVF_1$ to $FVF_n$.

In FIG. 2, the output buffer circuit 130 is illustrated as including a plurality of power delivery network (PDN) resistors $R_{PDN}$, but each of the plurality of PDN resistors $R_{PDN}$ may not be a resistor actually connected between output buffer circuits 130, and may be an internal resistor caused by a line included in the output buffer circuit 130. Due to the plurality of PDN resistors $R_{PDN}$, when the plurality of FVF buffers $FVF_1$ to $FVF_n$ are implemented to be equal or substantially equal to one another and the same error voltage $E_O$ is received, voltages having different levels may be output.

Also, in FIG. 2, a plurality of oscillators 210_1 to 210_n included in the output buffer circuit 130 are illustrated, and in some example embodiments the plurality of oscillators 210_1 to 210_n may be elements included in the clock oscillate circuit 200 of FIG. 1.

The plurality of FVF buffers $FVF_1$ to $FVF_n$ may generate the plurality of output voltages $V_{O1}$ to $V_{On}$, based on the error voltage $E_O$ and the plurality of trimming signals $TRM_1$ to $TRM_{n-1}$. The number of FVF buffers $FVF_1$ to $FVF_n$ may be an n number which is equal to the number of output voltages $V_{O1}$ to $V_{On}$, and may include first to nth FVF buffers $FVF_1$ to $FVF_n$.

The plurality of FVF buffers $FVF_1$ to $FVF_n$ may receive the error voltage $E_O$ output from the amplifier 110. At this time, the first FVF buffer $FVF_1$ may not receive the plurality of trimming signals $TRM_1$ to $TRM_{n-1}$. This may be because the plurality of output voltages $V_{O1}$ to $V_{On}$ are controlled to be equal or substantially equal to a level of the first output voltage $V_{O1}$. Also, the second to nth FVF buffers $FVF_2$ to $FVF_n$ may receive the first to n−1th trimming signals $TRM_1$ to $TRM_{n-1}$. For example, the kth FVF buffer $FVF_k$ may receive the k−1th trimming signal $TRM_{k-1}$.

The first FVF buffer $FVF_1$ may generate the first output voltage $V_{O1}$, based on the error voltage $E_O$.

The second to nth FVF buffers $FVF_2$ to $FVF_n$ may generate the second to nth output voltages $V_{O2}$ to $V_{On}$, based on the error voltage $E_O$ and the first to n−1th trimming signals $TRM_1$ to $TRM_{n-1}$. For example, the kth FVF buffer $FVF_k$ may generate the kth output voltage $V_{Ok}$, based on the error voltage $E_O$ and the k−1th trimming signal $TRM_{k-1}$.

In an example embodiment, the second to nth FVF buffers $FVF_2$ to $FVF_n$ may respectively control a bias current, based on the first to n−1th trimming signals $TRM_1$ to $TRM_{n-1}$, and may generate the second to nth output voltages $V_{O2}$ to $V_{On}$, based on the controlled bias current. An example embodiment where the second to nth FVF buffers $FVF_2$ to $FVF_n$ control the bias current will be described below in more detail with reference to FIG. 4.

In an example embodiment, the second to nth FVF buffers $FVF_2$ to $FVF_n$ may respectively control connections between a plurality of target switching elements, based on the first to n−1th trimming signals $TRM_1$ to $TRM_{n-1}$, and may generate the second to nth output voltages $V_{O2}$ to $V_{On}$, based on voltages by the plurality of target switching elements. An example embodiment where the second to nth FVF buffers $FVF_2$ to $FVF_n$ control the connections between the plurality of target switching elements will be described below in more detail with reference to FIG. 5.

Figure 3:
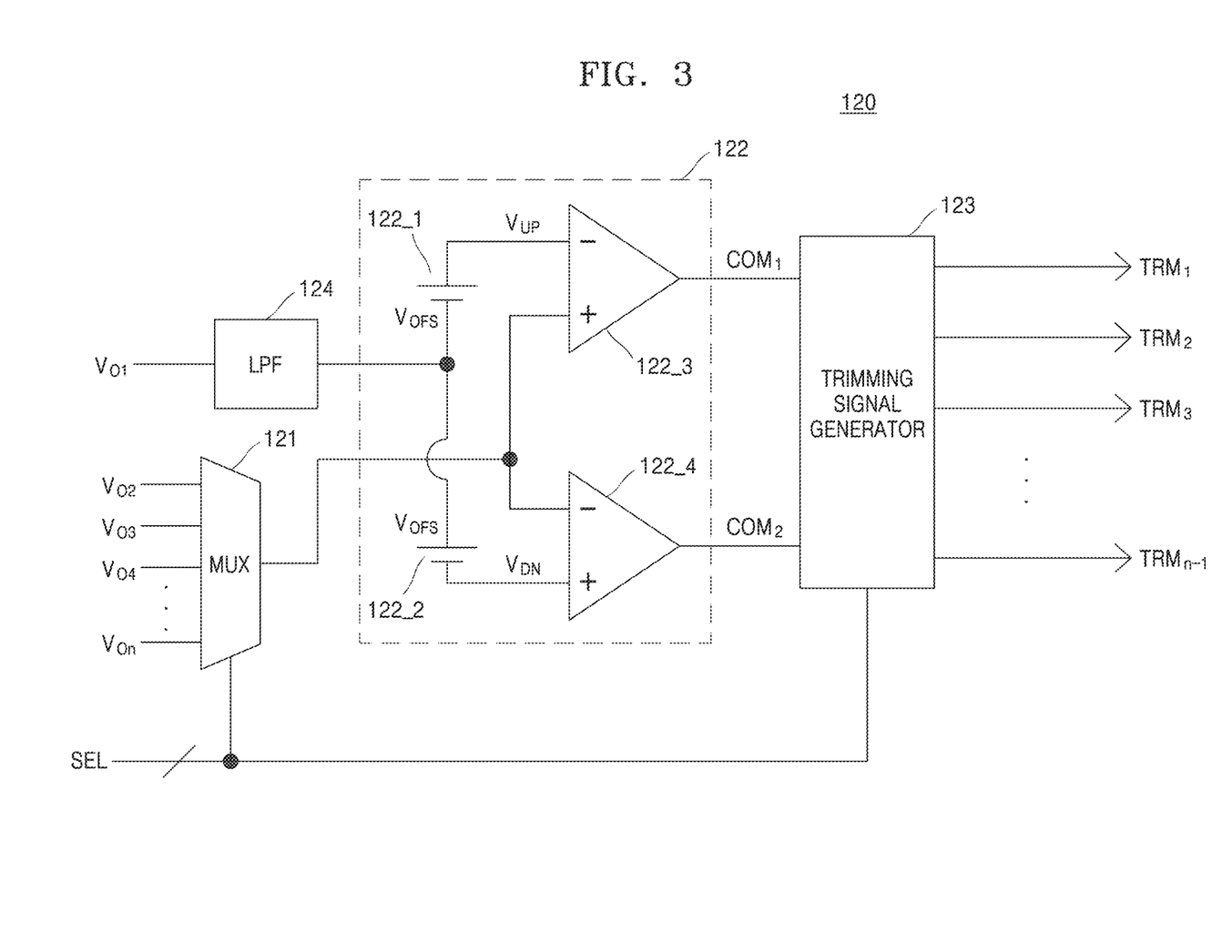
FIG. 3 is a circuit diagram illustrating a detailed configuration of a trimming control circuit of an LDO regulator according to an example embodiment.

FIG. 3 is a circuit diagram illustrating a detailed configuration of a trimming control circuit 120 of an LDO regulator according to an example embodiment.

Referring to FIG. 3, the trimming control circuit 120 according to an embodiment may include a multiplexer (MUX) 121, a comparison circuit 122, and a trimming signal generator 123. According to an example embodiment, the trimming control circuit 120 may further include a low pass filter (LPF) 124.

The multiplexer 121 may output one of second to nth output voltages $V_{O2}$ to $V_{On}$, based on a selection signal SEL.

The selection signal SEL may be a signal which is used for driving of the multiplexer 121 in the trimming control circuit 120. In an example embodiment, the selection signal SEL may be previously set so that multiplexer 121 alternately selects the second to nth output voltages $V_{O2}$ to $V_{On}$.

The multiplexer 121 may sequentially output the second to nth output voltages $V_{O2}$ to $V_{On}$, based on the selection signal SEL. That is, the multiplexer 121 may sequentially output the second output voltage $V_{O2}$, and the third output voltage $V_{O3}$, and the fourth output voltage $V_{O4}$, based on the selection signal SEL.

The comparison circuit 122 may compare the first output voltage $V_{O1}$ with the kth output voltage $V_{Ok}$ output by the multiplexer 121 to output comparison signals $COM_1$ and $COM_2$. In an example embodiment, the comparison signals $COM_1$ and $COM_2$ may include a first comparison signal $COM_1$ and a second comparison signal $COM_2$. The comparison circuit 122 may output, as the comparison signals $COM_1$ and $COM_2$, a result obtained by determining whether the kth output voltage $V_{Ok}$ output by the multiplexer 121 is within a desired (or alternatively, predetermined) reference error range with respect to the first output voltage $V_{O1}$.

The comparison circuit 122 may include a first power source 122_1, a second power source 122_2, a first comparator 122_3, and a second comparator 122_4.

The first power source 122_1 may summate the first output voltage $V_{O1}$ and an offset voltage $V_{OFS}$ to output an upper voltage $V_{UP}$.

In more detail, the first power source 122_1 may be a power element having a level of the offset voltage $V_{OFS}$. The offset voltage $V_{OFS}$ may be set to a value corresponding to half of the reference error range. The first power source 122_1 may receive the first output voltage $V_{O1}$ through a negative terminal. Also, the first power source 122_1 may output, through a positive terminal, the upper voltage $V_{UP}$ having a level which is a sum of the first output voltage $V_{O1}$ and the offset voltage $V_{OFS}$. At this time, a positive terminal of the first power source 122_1 may be connected with the first comparator 122_3 described below.

The second power source 122_2 may subtract the offset voltage $V_{OFS}$ from the first output voltage $V_{O1}$ to output a lower voltage $V_{DN}$.

In more detail, the second power source 122_2 may be a power element having a level of the offset voltage $V_{OFS}$. In some example embodiments, the second power source 122_2 may be a power element having a voltage having the same or substantially the same level as that of the first power source 122_1. The second power source 122_2 may receive the first output voltage $V_{O1}$ through a positive terminal. Also, the second power source 122_2 may output, through a negative terminal, the lower voltage $V_{DN}$ having a level obtained by subtracting the offset voltage $V_{OFS}$ from the first output voltage $V_{O1}$. At this time, a negative terminal of the second power source 122_2 may be connected with the second comparator 122_4 described below.

The first comparator 122_3 may compare the upper voltage $V_{UP}$ with the kth output voltage $V_{Ok}$ to generate the first comparison signal $COM_1$. The first comparison signal $COM_1$ may be a signal representing a result obtained by determining whether the kth output voltage $V_{Ok}$ is greater than an upper limit of the reference error range. For example, the first comparator 122_3 may subtract the upper voltage $V_{UP}$ from the kth output voltage $V_{Ok}$ and may generate the first comparison signal $COM_1$, based on whether a subtraction result has a positive value.

When the kth output voltage $V_{Ok}$ is greater than the upper voltage $V_{UP}$, the first comparator 122_3 may output the first comparison signal $COM_1$ having a first value (for example, logic 1). On the other hand, when the kth output voltage $V_{Ok}$ is less than or equal to the upper voltage $V_{UP}$, the first comparator 122_3 may output the first comparison signal $COM_1$ having a second value (for example, logic 0).

The second comparator 122_4 may compare the lower voltage $V_{DN}$ with the kth output voltage $V_{Ok}$ to generate the second comparison signal $COM_2$. The second comparison signal $COM_2$ may be a signal representing a result obtained by determining whether the kth output voltage $V_{Ok}$ is greater than a lower limit of the reference error range. For example, the second comparator 122_4 may subtract the lower voltage $V_{DN}$ from the kth output voltage $V_{Ok}$ and may generate the second comparison signal $COM_2$, based on whether a subtraction result has a positive value.

When the kth output voltage $V_{Ok}$ is less than the lower voltage $V_{DN}$, the second comparator 122_4 may output the second comparison signal $COM_2$ having a third value (for example, logic 1). On the other hand, when the kth output voltage $V_{Ok}$ is greater than or equal to the lower voltage $V_{DN}$, the second comparator 122_4 may output the second comparison signal $COM_2$ having a fourth value (for example, logic 0).

The trimming signal generator 123 may generate the k−1th trimming signal $TRM_{k-1}$, based on the selection signal SEL and the comparison signals $COM_1$ and $COM_2$.

In an example embodiment, when the first comparison signal $COM_1$ has the first value, the trimming signal generator 123 may generate the k−1th trimming signal $TRM_{k-1}$ for control which is performed to reduce the kth output voltage $V_{Ok}$. Because a case where the first comparison signal $COM_1$ has the first value denotes that the kth output voltage $V_{Ok}$ is greater than the upper limit of the reference error range, the trimming signal generator 123 may generate the k−1th trimming signal $TRM_{k-1}$ for control which is performed to reduce the kth output voltage $V_{Ok}$.

In an example embodiment, when the second comparison signal $COM_2$ has the third value, the trimming signal generator 123 may generate the k−1th trimming signal $TRM_{k-1}$ for control which is performed to increase the kth output voltage $V_{Ok}$. Because a case where the second comparison signal $COM_2$ has the third value denotes that the kth output voltage $V_{O1}$ (is smaller than the lower limit of the reference error range, the trimming signal generator 123 may generate the k−1th trimming signal $TRM_{k-1}$ for control which is performed to increase the kth output voltage $V_{Ok}$.

In an example embodiment, when where the first comparison signal $COM_1$ has the second value and the second comparison signal $COM_2$ has the fourth value, the trimming signal generator 123 may generate the k−1th trimming signal $TRM_{k-1}$ for control which is performed to intactly maintain the kth output voltage $V_{Ok}$. Because a case where the first comparison signal $COM_1$ has the second value and the second comparison signal $COM_2$ has the fourth value denotes that the kth output voltage $V_{O1}$ (is within the reference error range, the trimming signal generator 123 may generate the k−1th trimming signal $TRM_{k-1}$ for control which is performed to intactly maintain the kth output voltage $V_{Ok}$.

The trimming signal generator 123 may receive the same selection signal SEL simultaneously with the multiplexer 121. For example, when a selection signal for allowing the kth output voltage $V_{O1}$ (to be output is input to the multiplexer 121, the trimming signal generator 123 may receive the same selection signal SEL simultaneously or substantially simultaneously, and thus, may generate the k−1th trimming signal $TRM_{k-1}$ for control which is performed so that a level of the first output voltage $V_{O1}$ and a level of the kth output voltage $V_{O1}$ (are maintained to be equal to each other. Therefore, the trimming signal generator 123 may sequentially generate the first to n−1th trimming signals $TRM_1$ to $TRM_{n-1}$, based on the selection signal SEL. That is, the trimming signal generator 123 may sequentially output the first trimming signal $TRM_1$, the second trimming signal $TRM_2$, and the third trimming signal $TRM_3$, based on the selection signal SEL.

The low pass filter 124 may remove noise included in the first output voltage $V_{O1}$ and may input the noise-removed first output voltage $V_{O1}$. The low pass filter 124 may receive the first output voltage $V_{O1}$. The low pass filter 124 may remove high frequency noise included in the received first output voltage $V_{O1}$. The low pass filter 124 may output the noise-removed first output voltage $V_{O1}$ to the comparison circuit 122.

Figure 4:
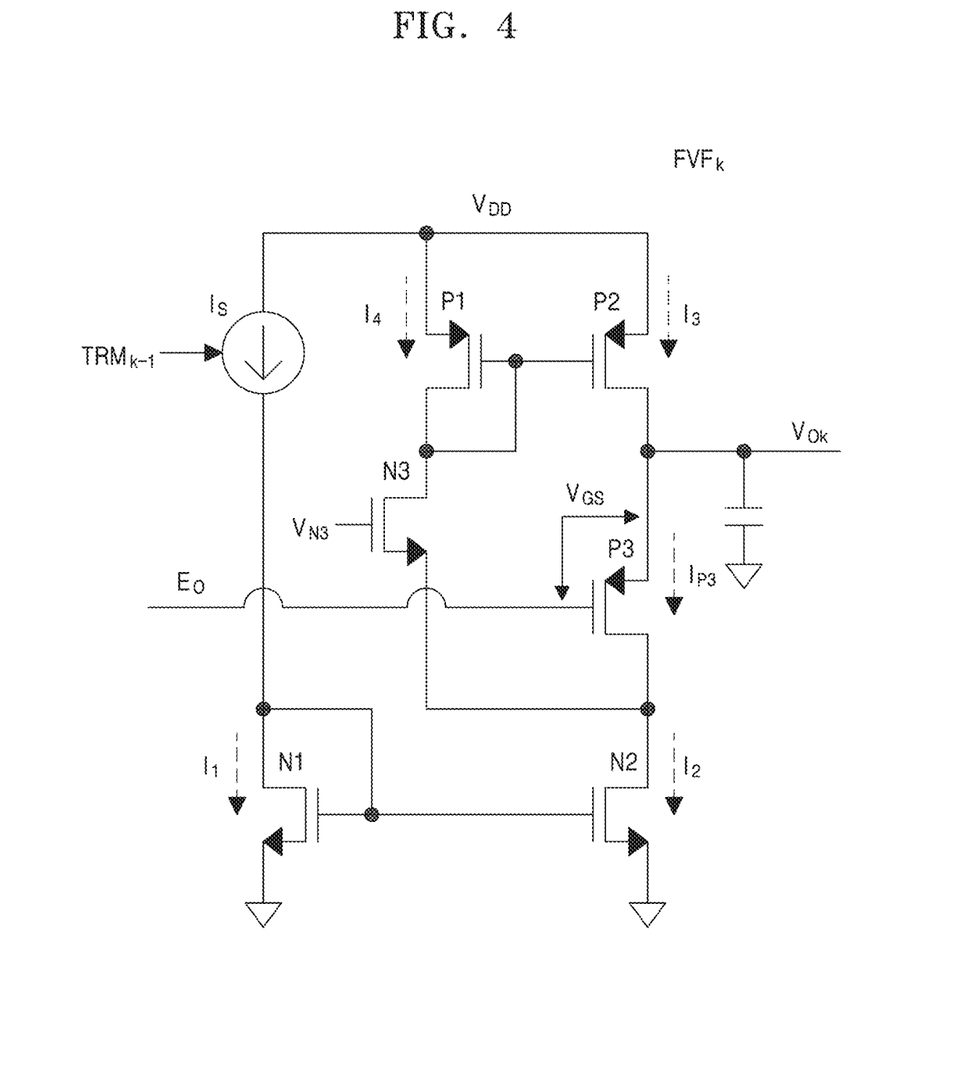
FIG. 4 is a circuit diagram illustrating an example embodiment of a flipped voltage follower (FVF) buffer of an LDO regulator.

FIG. 4 is a circuit diagram illustrating an embodiment of an FVF buffer of an LDO regulator 100 according to an example embodiment.

Referring to FIG. 4, an example of the circuit implementation of second to nth FVF buffers $FVF_2$ to $FVF_n$ included in an output buffer circuit 130 included in the LDO regulator 100 according to an example embodiment may be seen.

In the example embodiment of FIG. 4, the kth FVF buffer $FVF_k$ may include a current source $I_S$, a first switching element N1, a second switching element N2, a third switching element N3, a fourth switching element P1, a fifth switching element P2, and a sixth switching element P3.

The current source $I_S$ may supply a bias current to the first switching element N1. Therefore, a first current $I_1$ may be applied to one terminal of the first switching element N1. The first switching element N1 and the second switching element N2 may operate as a current mirror. Accordingly, a second current $I_2$ having a desired (or alternatively, predetermined) ratio to the first current $I_1$ may flow in the second switching element N2.

The third switching element N3 may operate based on an input voltage $V_{N3}$.

The same third current $I_3$ as an output current may flow in the fifth switching element P2. At this time, the fourth switching element P1 and the fifth switching element P2 may operate as a current mirror. Accordingly, a fourth current $I_4$ having a desired (or alternatively, predetermined) ratio to the third current $I_3$ may flow in the fourth switching element P1.

An error voltage $E_O$ may be input to a gate terminal of the sixth switching element P3. A voltage input to the gate terminal of the sixth switching element P3 may increase by a gate-source voltage $V_{GS}$, and thus, the kth output voltage $V_{Ok}$ may be generated.

In some example embodiments, the kth output voltage $V_{Ok}$ may be expressed as in the following Equation 1.

$$V_{Ok} = E_O + V_{GS} = E_O + \sqrt{\frac{2 \times \left(I_1 \times \frac{B}{A} - I_3 \times \frac{C}{D}\right)}{\beta_{P3} \times \frac{W_{P3}}{L_{P3}}}} + V_{THP3} \quad \text{[Equation 1]}$$

In Equation 1, B/A may denote a current ratio between the first switching element N1 and the second switching element N2, and C/D may denote a current ratio between the fourth switching element P1 and the fifth switching element P2. Also, $\beta_{P3}$ may denote a current gain of the sixth switching element P3, $W_{P3}$ may denote a width of the sixth switching element P3, $L_{P3}$ may denote a length of the sixth switching element P3, and $V_{THP3}$ may denote a threshold voltage of the sixth switching element P3.

In the example embodiment of FIG. 4, the k−1th trimming signal $TRM_{k-1}$ may be applied to the current source $I_S$. At this time, the current source $I_S$ may adjust a bias current, based on the k−1th trimming signal $TRM_{k-1}$. The bias current of the current source $I_S$ may be the first current $I_1$ and may be applied to one terminal of the first switching element N1.

When the k−1th trimming signal $TRM_{k-1}$ is a signal for control performed to increase the kth output voltage $V_{Ok}$, the current source $I_S$ may increase the bias current. Therefore, the first current $I_1$ may increase. In some example embodiments, as in Equation 1, the kth output voltage $V_{Ok}$ may be proportional to the first current $I_1$, and thus, the kth output voltage $V_{Ok}$ may increase.

When the k−1th trimming signal $TRM_{k-1}$ is a signal for control performed to decrease the kth output voltage $V_{Ok}$, the current source $I_S$ may decrease the bias current. Therefore, the first current $I_1$ may decrease. In some example embodiments, as in Equation 1, the kth output voltage $V_{Ok}$ may be proportional to the first current $I_1$, and thus, the kth output voltage $V_{Ok}$ may decrease.

When the k−1th trimming signal $TRM_{k-1}$ is a signal for control performed to intactly maintain the kth output voltage $V_{Ok}$, the current source $I_S$ may intactly maintain the bias current. Therefore, the first current $I_1$ may be intactly maintained, and the kth output voltage $V_{Ok}$ may be intactly maintained.

As described above, the LDO regulator 100 according to an example embodiment may generate a plurality of trimming signals $TRM_1$ to $TRM_{n-1}$ generated by the trimming control circuit 120, based on a plurality of output voltages $V_{O1}$ to $V_{On}$, and may adjust a bias current based on the current source $I_S$ included in the second to nth FVF buffers $FVF_2$ to $FVF_n$ of the output buffer circuit 130 to control constant levels of the second to nth FVF buffers $FVF_2$ to $FVF_n$, based on the plurality of trimming signals $TRM_1$ to $TRM_{n-1}$. Therefore, by applying the plurality of constant output voltages $V_{O1}$ to $V_{On}$ to the clock oscillate circuit 200, the occurrence of clock skew between a plurality of clock signals $CLK_1$ to $CLK_n$ generated by the clock generating circuit 10 may be reduced or prevented.

Figure 5:
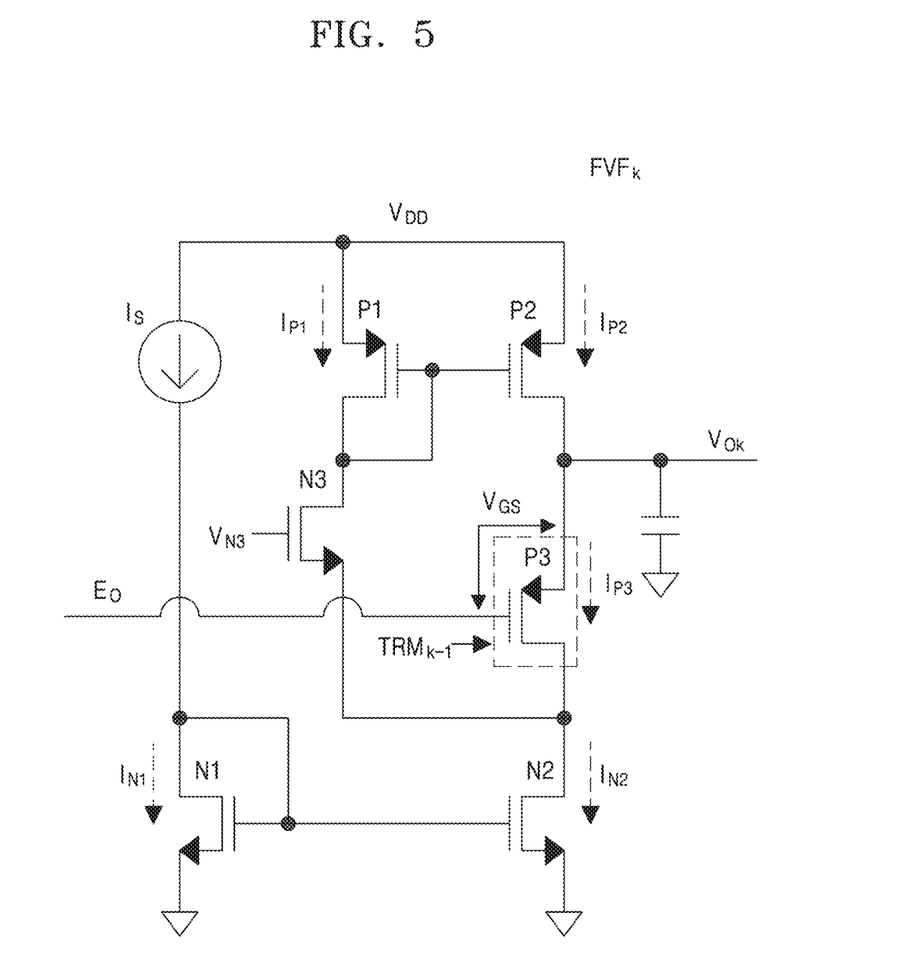
FIG. 5 is a circuit diagram illustrating another example embodiment of an FVF buffer of an LDO regulator.

FIG. 5 is a circuit diagram illustrating another embodiment of an FVF buffer of an LDO regulator 100 according to an example embodiment.

Referring to FIG. 5, another example of the circuit implementation of second to nth FVF buffers $FVF_2$ to $FVF_n$ included in an output buffer circuit 130 included in the LDO regulator 100 according to an example embodiment may be seen. An example of circuit implementation illustrated in FIG. 5 may be similar to an example of circuit implementation illustrated in FIG. 4, and thus, a difference therebetween will be mainly described.

In the example embodiment of FIG. 5, unlike the embodiment of FIG. 4, a k−1th trimming signal $TRM_{k-1}$ may be applied to a sixth switching element P3 instead of a current source $I_S$. In some example embodiments, the sixth switching element P3 may include a plurality of target switching elements connected with one another in parallel.

Connections between the plurality of target switching elements may be controlled based on the k−1th trimming signal $TRM_{k-1}$. At this time, connections between the plurality of target switching elements may be controlled to adjust the number of target switching elements which operate based on the k−1th trimming signal $TRM_{k-1}$.

When the k−1th trimming signal $TRM_{k-1}$ is a signal for control performed to increase a kth output voltage $V_{Ok}$, the number of target switching elements operating among the plurality of target switching elements may decrease. Accordingly, a width $W_{P3}$ of the sixth switching element P3 may decrease. In some example embodiments, as in Equation 1, the kth output voltage $V_{Ok}$ may be inversely proportional to the width $W_{P3}$ of the sixth switching element P3, and thus, the kth output voltage $V_{Ok}$ may increase.

When the k−1th trimming signal $TRM_{k-1}$ is a signal for control performed to decrease the kth output voltage $V_{Ok}$, the number of target switching elements operating among the plurality of target switching elements may increase. Accordingly, the width $W_{P3}$ of the sixth switching element P3 may increase. In some example embodiments, as in Equation 1, the kth output voltage $V_{Ok}$ may be inversely proportional to the width $W_{P3}$ of the sixth switching element P3, and thus, the kth output voltage $V_{Ok}$ may decrease.

When the k−1th trimming signal $TRM_{k-1}$ is a signal for control performed to intactly maintain the kth output voltage $V_{Ok}$, the number of target switching elements operating among the plurality of target switching elements may be maintained identically or substantially identically. Accordingly, the kth output voltage $V_{Ok}$ may be intactly maintained.

As described above, the LDO regulator 100 according to an example embodiment may generate a plurality of trimming signals $TRM_1$ to $TRM_{n-1}$ generated by the trimming control circuit 120, based on a plurality of output voltages $V_{O1}$ to $V_{On}$, and may adjust the number of target switching elements operating among the plurality of target switching elements included in the second to nth FVF buffers $FVF_2$ to $FVF_n$ of the output buffer circuit 130 to control constant levels of a plurality of output voltages $V_{O1}$ to $V_{On}$, based on the plurality of trimming signals $TRM_1$ to $TRM_{n-1}$. Therefore, by applying the plurality of constant output voltages $V_{O1}$ to $V_{On}$ to the clock oscillate circuit 200, the occurrence of clock skew between a plurality of clock signals $CLK_1$ to $CLK_n$ generated by the clock generating circuit 10 may be prevented.

Figure 6:
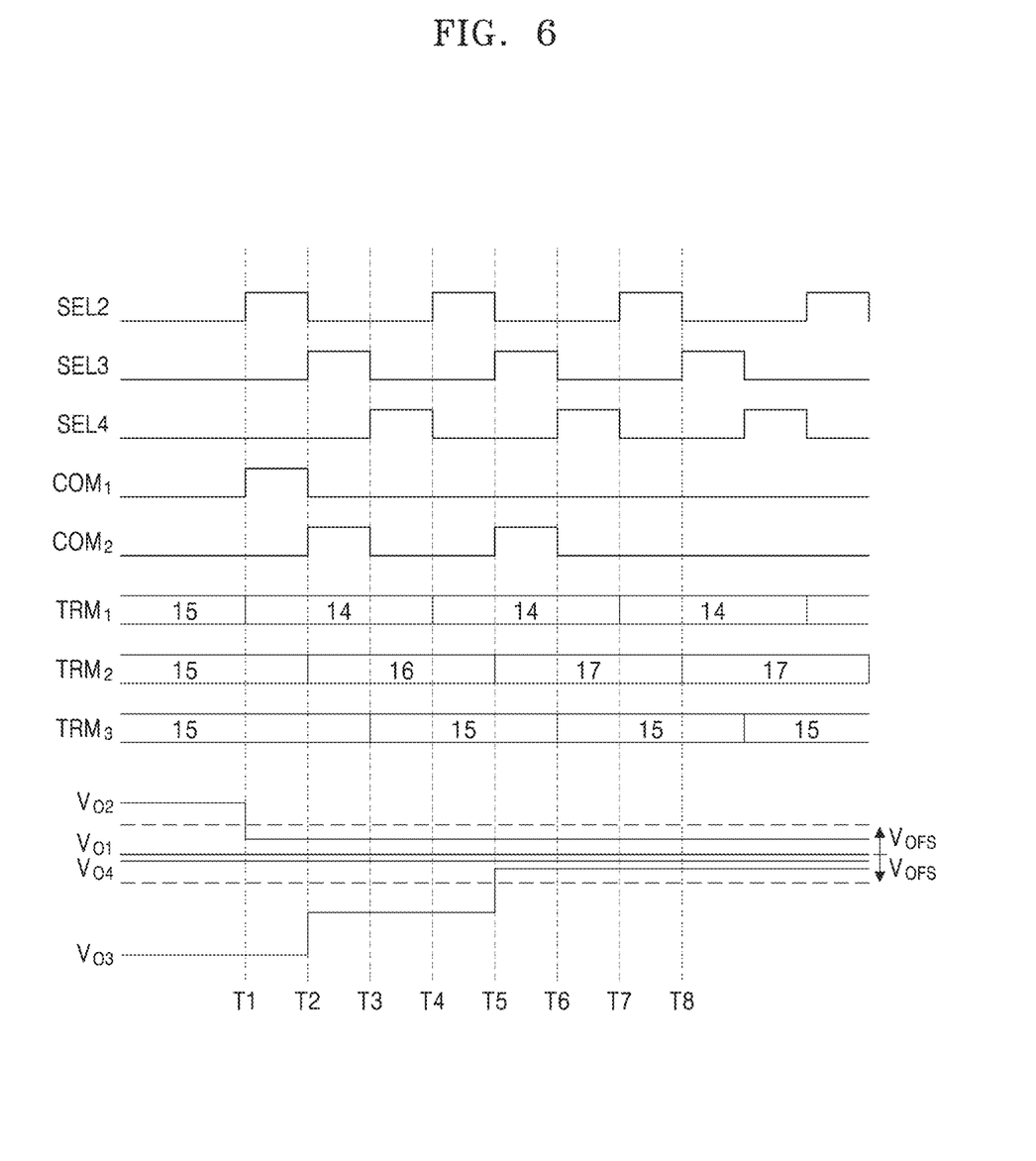
FIG. 6 is a timing diagram illustrating a voltage and a signal of a trimming control circuit of an LDO regulator according to an example embodiment.

FIG. 6 is a timing diagram illustrating a voltage and a signal of a trimming control circuit of an LDO regulator 100 according to an example embodiment.

Referring to FIG. 6, in the LDO regulator 100 according to an example embodiment, a timing diagram showing variations of first to fourth output voltages $V_{O1}$ to $V_{O4}$, selection signals SEL2 to SEL4, comparison signals (for example, first and second comparison signals) $COM_1$ and $COM_2$, and first to third trimming signals $TRM_1$ to $TRM_3$ may be seen.

Here, the selection signals SEL2 to SEL4 may include a second selection signal SEL2 which allows a multiplexer 121 to output a second output voltage $V_{O2}$, a third selection signal SEL3 which allows the multiplexer 121 to output a third output voltage $V_{O3}$, and a fourth selection signal SEL4 which allows the multiplexer 121 to output a fourth output voltage $V_{O4}$.

At a first time T1, the second selection signal SEL2 may be activated. At this time, the second output voltage $V_{O2}$ may be greater than the first output voltage $V_{O1}$ by a value of the offset voltage $V_{OFS}$ or more, and thus, the first comparison signal $COM_1$ may have a first value. Accordingly, it may be seen that a value of the first trimming signal $TRM_1$ decreases, and thus, the second output voltage $V_{O2}$ decreases. Also, the second FVF buffer $FVF_2$ may output the second output voltage $V_{O2}$ which is reduced based on the first trimming signal $TRM_1$.

At a second time T2, the third selection signal SEL3 may be activated. At this time, the third output voltage $V_{O3}$ may be below the first output voltage $V_{O1}$ by a value of the offset voltage $V_{OFS}$ or more, and thus, the second comparison signal $COM_2$ may have a third value. Accordingly, it may be seen that a value of the second trimming signal $TRM_2$ increases, and thus, the third output voltage $V_{O3}$ increases.

Also, the third FVF buffer $FVF_3$ may output the third output voltage $V_{O3}$ which increases based on the second trimming signal $TRM_2$.

At a third time T3, the fourth selection signal SEL4 may be activated. At this time, because the fourth output voltage $V_{O4}$ is within the reference error range with respect to the first output voltage $V_{O1}$, the first comparison signal $COM_1$ may have a second value, and the second comparison signal $COM_2$ may have a fourth value. Accordingly, it may be seen that a value of the third trimming signal $TRM_3$ is maintained, and thus, the fourth output voltage $V_{O4}$ is maintained. Also, the fourth FVF buffer $FVF_4$ may output the same fourth output voltage $V_{O4}$, based on the third trimming signal $TRM_3$.

At a fourth time T4, the second selection signal SEL2 may be activated. At this time, the second output voltage $V_{O2}$ may decrease at the first time T1, and thus, the second output voltage $V_{O2}$ may be within the reference error range with respect to the first output voltage $V_{O1}$. Accordingly, the first comparison signal $COM_1$ may have the second value, and the second comparison signal $COM_2$ may have the fourth value. Accordingly, it may be seen that a value of the first trimming signal $TRM_1$ is maintained, and thus, the second output voltage $V_{O2}$ is maintained. Also, the second FVF buffer $FVF_2$ may output the same second output voltage $V_{O2}$, based on the first trimming signal $TRM_1$.

At a fifth time T5, the third selection signal SEL3 may be activated. At this time, even when the third output voltage $V_{O3}$ may increase at the second time T2, the third output voltage $V_{O3}$ may be below the first output voltage $V_{O1}$ by a value of the offset voltage $V_{OFS}$ or more, and thus, the second comparison signal $COM_2$ may have the third value. Accordingly, it may be seen that a value of the second trimming signal $TRM_2$ increases, and thus, the third output voltage $VO_3$ increases. Also, the third FVF buffer $FVF_3$ may output the third output voltage $V_{O3}$ which increases based on the second trimming signal $TRM_2$.

At a sixth time T6, the fourth selection signal SEL4 may be activated. Like the third time T3, the fourth output voltage $V_{O4}$ may be within the reference error range with respect to the first output voltage $V_{O1}$, and thus, may be controlled to be equal or substantially equal to the third time T3, whereby the same or substantially the same fourth output voltage $V_{O4}$ may be output.

At a seventh time T7, the second selection signal SEL2 may be activated. Like the fourth time T4, the second output voltage $V_{O1}$ may be within the reference error range with respect to the first output voltage $V_{O1}$, and thus, may be controlled to be equal or substantially equal to the fourth time T4, whereby the same or substantially the same second output voltage $V_{O1}$ may be output.

At an eighth time T8, the third selection signal SEL3 may be activated. At this time, the fifth output voltage $V_{O3}$ may increase at the fifth time T5, and thus, the third output voltage $V_{O3}$ may be within the reference error range with respect to the first output voltage $V_{O1}$. Accordingly, the first comparison signal $COM_1$ may have the second value, and the second comparison signal $COM_2$ may have the fourth value. Accordingly, it may be seen that a value of the second trimming signal $TRM_2$ is maintained, and thus, the third output voltage $V_{O3}$ is maintained. Also, the third FVF buffer $FVF_3$ may output the same third output voltage $V_{O3}$, based on the second trimming signal $TRM_2$.

As described above, the LDO regulator 100 according to an example embodiment may sequentially output the second to nth output voltages $V_{O1}$ to $V_{On}$ by using the multiplexer 121, sequentially generate the first to n–1th trimming signals $TRM_1$ to $TRM_{n-1}$, and sequentially adjust the second to nth output voltages $V_{O1}$ to $V_{On}$. Accordingly, a voltage difference between the plurality of output voltages $V_{O1}$ to $V_{On}$ may be adjusted to within the reference error range, and thus, the occurrence of clock skew between the plurality of clock signals $CLK_1$ to $CLK_n$ generated by the clock generating circuit 10 may be reduced or prevented.

Figure 7:
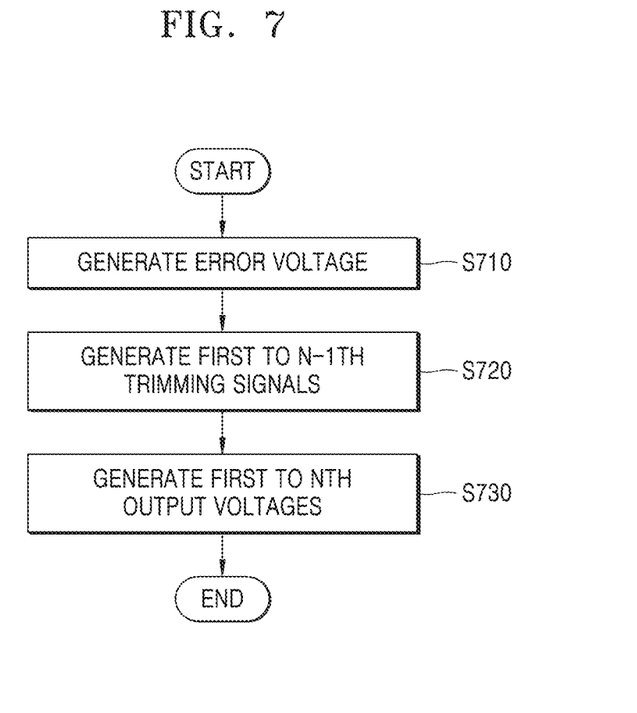
FIG. 7 is a flowchart illustrating an operating method of an LDO regulator, according to an example embodiment.

FIG. 7 is a flowchart illustrating an operating method of an LDO regulator, according to an example embodiment.

Referring to FIG. 7, in operation S710, the LDO regulator 100 may generate the error voltage $E_O$. The LDO regulator 100 may amplify a difference between the first output voltage $V_{O1}$ and the reference voltage $V_{REF}$ by using the amplifier 110 to generate the error voltage $E_O$.

In operation S720, the LDO regulator 100 may generate the first to n–1th trimming signals $TRM_1$ to $TRM_{n-1}$. The LDO regulator 100 may generate the first to n–1th trimming signals $TRM_1$ to $TRM_{n-1}$ by using the trimming control circuit 120, based on the plurality of output voltages $V_{O1}$ to $V_{On}$. The trimming control circuit 120 may sequentially generate each of the first to n–1th trimming signals $TRM_1$ to $TRM_{n-1}$. A method of generating each of the first to n–1th trimming signals $TRM_1$ to $TRM_{n-1}$ will be described below in more detail with reference to FIG. 8.

Figure 8:
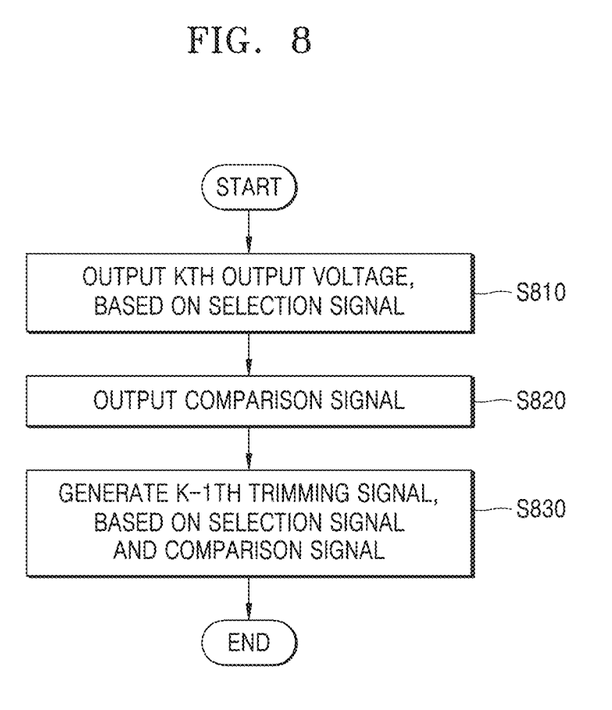
FIG. 8 is a flowchart illustrating an operating method of a trimming control circuit of an LDO regulator, according to an example embodiment.

FIG. 8 is a flowchart illustrating an operating method of a trimming control circuit of an LDO regulator, according to an example embodiment.

Referring to FIG. 8, in operation S810, the trimming control circuit 120 may output the kth output voltage $V_{Ok}$, based on the selection signal SEL. The trimming control circuit 120 may output, through the multiplexer 121, the kth output voltage $V_{Ok}$ which is one of the second to nth output voltages $V_{O1}$ to $V_{On}$, based on the selection signal SEL.

In operation S820, the trimming control circuit 120 may output the comparison signals $COM_1$ and $COM_2$. The trimming control circuit 120 may determine whether the kth output voltage $V_{Ok}$ is within the reference error range with respect to the first output voltage $V_{O1}$ and may output the comparison signals $COM_1$ and $COM_2$ representing a comparison result.

In operation S830, the trimming control circuit 120 may generate the k–1th trimming signal $TRM_{k-1}$, based on the selection signal SEL and the comparison signals $COM_1$ and $COM_2$. The trimming control circuit 120 may generate the k–1th trimming signal $TRM_{k-1}$ corresponding to the selection signal SEL by using the trimming signal generator 123, based on the comparison signals $COM_1$ and $COM_2$.

Returning to FIG. 7, in step S730, the LDO regulator 100 may generate the first to nth output voltages $V_{O1}$ to $V_{On}$. The LDO regulator 100 may generate the first to nth output voltages $V_{O1}$ to $V_{On}$ by using the output buffer circuit 130. At this time, the output buffer circuit 130 may generate the first to nth output voltages $V_{O1}$ to $V_{On}$ by using the plurality of FVF buffers $FVF_1$ to $FVF_n$, based on the error voltage $E_O$ and the first to n–1th trimming signals $TRM_1$ to $TRM_{n-1}$.

Figure 9:
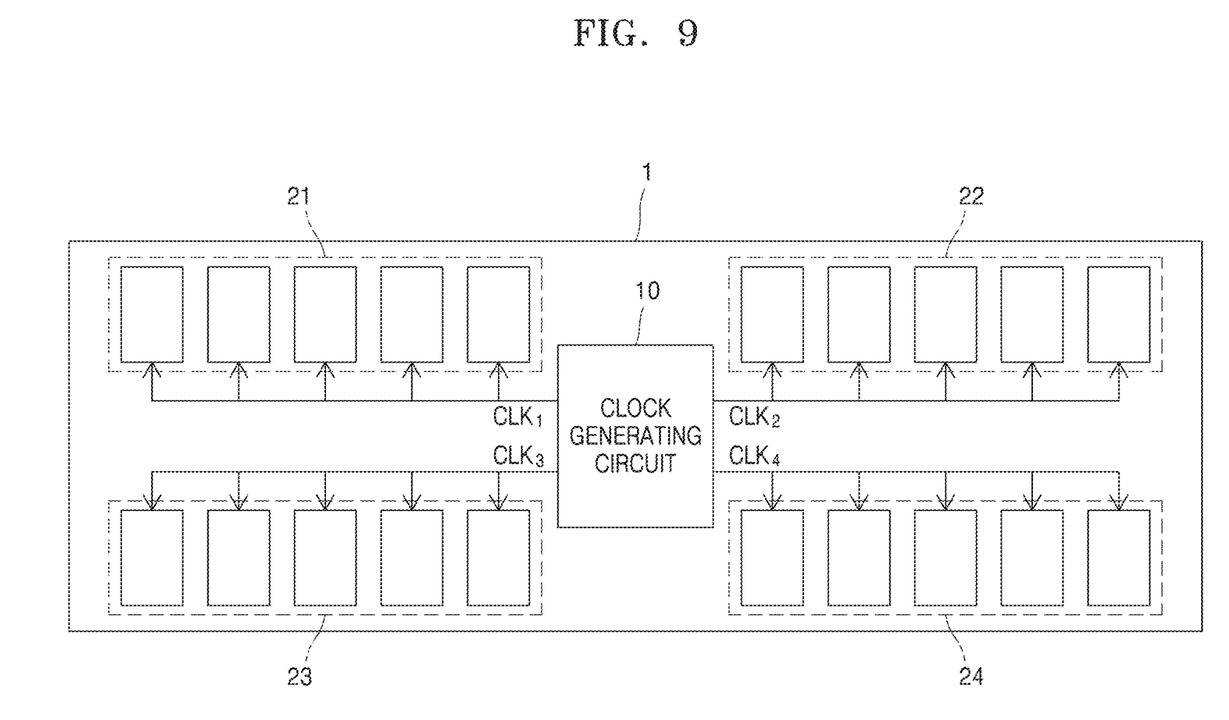
FIG. 9 is a block diagram illustrating a memory device according to an example embodiment.

FIG. 9 is a block diagram illustrating a memory device 1 according to an example embodiment.

Referring to FIG. 9, the memory device 1 according to an example embodiment may include a clock generating circuit 10 and a plurality of DRAM chips (for example, first to fourth DRAM chips) 21 to 24.

The clock generating circuit 10 may operate like the clock generating circuit 10 described above with reference to FIGS. 1 to 8.

A first clock signal $CLK_1$ generated by the clock generating circuit 10 may be applied to the first DRAM chip 21. A second clock signal $CLK_2$ generated by the clock generating circuit 10 may be applied to the second DRAM chip 22. A third clock signal $CLK_3$ generated by the clock generating circuit 10 may be applied to the third DRAM chip 23. A fourth clock signal $CLK_4$ generated by the clock generating circuit 10 may be applied to the fourth DRAM chip 24.

The plurality of DRAM chips 21 to 24 included in the memory device 1 may operate based on the plurality of clock signals $CLK_1$ to $CLK_4$ generated by the clock generating circuit described above with reference to FIGS. 1 to 8, and thus, may reduce or prevent the occurrence of clock skew between the plurality of clock signals $CLK_1$ to $CLK_4$. Accordingly, a malfunction of the memory device 1 caused by clock skew may be reduced or prevented.

Hereinabove, some example embodiments have been described in the drawings and the specification. Example embodiments have been described by using the terms described herein, but this has been merely used for describing the inventive concepts and has not been used for limiting a meaning or limiting the scope of the inventive concepts. Therefore, it may be understood by those of ordinary skill in the art that various modifications and other example embodiments may be implemented from the inventive concepts.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the scope of the inventive concepts.

What is claimed is:

1. A low dropout (LDO) regulator configured to generate first to nth output voltages, where n is a natural number greater than or equal to 2, and each of the first to nth output voltages corresponds to a reference voltage, the LDO regulator comprising:
    an amplifier configured to generate an error voltage based on the reference voltage and a first output voltage of the first to nth output voltages;
    a trimming control circuit configured to generate first to (n−1)th trimming signals based on the first to nth output voltages; and
    an output buffer circuit configured to generate the first to nth output voltages based on the error voltage and the first to (n−1)th trimming signals.

2. The LDO regulator of claim 1, wherein the amplifier is configured to amplify a difference between the first output voltage of the first to nth output voltages and the reference voltage to generate the error voltage.

3. The LDO regulator of claim 1, wherein the trimming control circuit comprises:
    a multiplexer configured to output one of second to nth output voltages of the first to nth output voltages, based on a selection signal;
    a comparison circuit configured to compare the first output voltage of the first to nth output voltages with a kth output voltage output by the multiplexer, to output a comparison signal, where k is a natural number greater than or equal to 2 and less than or equal to n; and
    a trimming signal generator configured to generate a (k−1)th trimming signal of the first to (n−1)th trimming signals, based on the selection signal and the comparison signal.

4. The LDO regulator of claim 3, wherein the trimming control circuit further comprises a low pass filter configured to remove noise from the first output voltage of the first to nth output voltages and supply a noise-removed first output voltage to the comparison circuit.

5. The LDO regulator of claim 3, wherein
    the multiplexer is configured to sequentially output the second to nth output voltages based on the selection signal, and
    the trimming signal generator is further configured to sequentially generate the first to (n−1)th trimming signals based on the selection signal.

6. The LDO regulator of claim 3, wherein the comparison circuit comprises:
    a first power source configured to add an offset voltage to the first output voltage of the first to nth output voltages to output an upper voltage;
    a second power source configured to subtract the offset voltage from the first output voltage of the first to nth output voltages to output a lower voltage;
    a first comparator configured to compare the upper voltage with a kth output voltage of the first to nth output voltages, to generate a first comparison signal; and
    a second comparator configured to compare the lower voltage with the kth output voltage output by the multiplexer to generate a second comparison signal.

7. The LDO regulator of claim 6, wherein
    the first comparator is configured to output the first comparison signal having a first value when the kth output voltage output by the multiplexer is greater than the upper voltage, and output the first comparison signal having a second value when the kth output voltage is less than or equal to the upper voltage, and
    the second comparator is configured to output the second comparison signal having a third value when the kth output voltage output by the multiplexer is less than the lower voltage, and output the second comparison signal having a fourth value when the kth output voltage output by the multiplexer is greater than or equal to the lower voltage.

8. The LDO regulator of claim 7, wherein the trimming signal generator is configured to,
    generate the (k−1)th trimming signal of the first to (n−1)th trimming signals to decrease the kth output voltage when the first comparison signal has the first value,
    generate the (k−1)th trimming signal of the first to (n−1)th trimming signals to increase the kth output voltage when the second comparison signal has the third value, and
    generate the (k−1)th trimming signal of the first to (n−1)th trimming signals to maintain the kth output voltage when the first comparison signal has the second value and the second comparison signal has the fourth value.

9. The LDO regulator of claim 1, wherein the output buffer circuit is configured to,
    control a bias current based on the first to (n−1)th trimming signals, and
    generate the first to nth output voltages based on the bias current.

10. The LDO regulator of claim 1, wherein the output buffer circuit is configured to,
control connections between a plurality of target switching elements based on the first to (n−1)th trimming signals, and
generate the first to nth output voltages based on voltages of the plurality of target switching elements.

11. The LDO regulator of claim 1, wherein the output buffer circuit comprises:
a first flipped voltage follower (FVF) buffer configured to generate a first output voltage based on the error voltage; and
second to nth FVF buffers configured to generate second to nth output voltages based on the error voltage and the first to (n−1)th trimming signals.

12. The LDO regulator of claim 11, wherein each of the second to nth FVF buffers comprises a current source configured to adjust a bias current, based on each of the first to (n−1)th trimming signals.

13. The LDO regulator of claim 11, wherein
each of the second to nth FVF buffers comprises a plurality of target switching elements connected with one another in parallel, and
connections between the plurality of target switching elements are controlled based on the first to (n−1)th trimming signals.

14. A clock generating circuit comprising:
a low dropout (LDO) regulator configured to generate a plurality of output voltages each corresponding to a reference voltage; and
a clock oscillate circuit configured to generate a plurality of clock signals based on the plurality of output voltages,
wherein the LDO regulator comprises,
an amplifier configured to generate an error voltage based on the reference voltage and a first output voltage of the plurality of output voltages,
a trimming control circuit configured to generate a plurality of trimming signals based on the plurality of output voltages, and
an output buffer circuit configured to generate the plurality of output voltages based on the error voltage and the plurality of trimming signals.

15. The clock generating circuit of claim 14, wherein the trimming control circuit comprises:
a multiplexer configured to output one of second to nth output voltages of the plurality of output voltages based on a selection signal;
a comparison circuit configured to compare the first output voltage of the first to nth output voltages with a kth output voltage output by the multiplexer, to output a comparison signal, where k is a natural number greater than or equal to 2 and less than or equal to n; and
a trimming signal generator configured to generate a (k−1)th trimming signal of the plurality of trimming signals, based on the selection signal and the comparison signal.

16. The clock generating circuit of claim 15, wherein
the multiplexer is configured to sequentially output the second to nth output voltages based on the selection signal, and
the trimming signal generator is configured to sequentially generate the plurality of trimming signals based on the selection signal.

17. The clock generating circuit of claim 15, wherein the comparison circuit comprises:
a first power source configured to add an offset voltage to the first output voltage of the first to nth output voltages, to output an upper voltage;
a second power source configured to subtract the offset voltage from the first output voltage of the first to nth output voltages, to output a lower voltage;
a first comparator configured to compare the upper voltage with a kth output voltage of the plurality of output voltages, to generate a first comparison signal; and
a second comparator configured to compare the lower voltage with the kth output voltage output by the multiplexer to generate a second comparison signal.

18. The clock generating circuit of claim 14, wherein the output buffer circuit is configured to,
control a bias current based on the plurality of trimming signals, and
generate the plurality of output voltages based on the bias current.

19. The clock generating circuit of claim 14, wherein the output buffer circuit is configured to,
control connections between a plurality of target switching elements based on the plurality of trimming signals, and
generate the plurality of output voltages based on voltages of the plurality of target switching elements.

20. A memory device comprising:
a clock generating circuit configured to generate a plurality of clock signals; and
a plurality of dynamic random access memory (DRAM) chips configured to operate based on the plurality of clock signals,
wherein the clock generating circuit comprises,
a low dropout (LDO) regulator configured to generate a plurality of output voltages each corresponding to a reference voltage, and
a clock oscillate circuit configured to generate the plurality of clock signals, based on the plurality of output voltages, and
the LDO regulator comprises,
an amplifier configured to generate an error voltage based on the reference voltage and a first output voltage of the plurality of output voltages,
a trimming control circuit configured to generate a plurality of trimming signals based on the plurality of output voltages, and
an output buffer circuit configured to generate the plurality of output voltages based on the error voltage and the plurality of trimming signals.

* * * * *